US006878970B2

(12) United States Patent
Bour et al.

(10) Patent No.: US 6,878,970 B2
(45) Date of Patent: Apr. 12, 2005

(54) LIGHT-EMITTING DEVICE HAVING ELEMENT(S) FOR INCREASING THE EFFECTIVE CARRIER CAPTURE CROSS-SECTION OF QUANTUM WELLS

(75) Inventors: David P. Bour, Cupertino, CA (US); Michael H. Leary, Mountain View, CA (US); Ying-Lan Chang, Cupertino, CA (US); Yoon-Kyu Song, Warw ick, RI (US); Michael R. T. Tan, Menlo Park, CA (US); Tetsuya Takeuchi, Sunnyvale, CA (US); Danielle Chamberlin, San Mateo, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 8 days.

(21) Appl. No.: 10/418,408

(22) Filed: Apr. 17, 2003

(65) Prior Publication Data

US 2004/0206949 A1 Oct. 21, 2004

(51) Int. Cl.[7] .......................... H01L 33/00; H01L 29/06
(52) U.S. Cl. .............................. 257/94; 257/13; 257/15
(58) Field of Search .............................. 257/13, 94, 15, 257/22, 96, 97; 438/510

(56) References Cited

U.S. PATENT DOCUMENTS 6,046,096 A * 4/2000 Ouchi ........................ 438/510

6,172,382 B1 * 1/2001 Nagahama et al. ........... 257/94

OTHER PUBLICATIONS

D. P. Bour, et al.; "High–Power Conversion Efficiency in a Strained InGaAs/AlGaAs Quantum Well Laser"; May 1, 1989; Appl. Phys. Lett., vol. 65, No. 9, pp. 3340–3343.

D. P. Bour, et al.; "Improving the Performance of Strained InGaAs/AlGaAs Single Quantum Well Lasers"; Jan. 22, 1990; Appl. Phys. Lett., vol. 56, No. 4, pp. 318–320.

D. P. Bour, et al., "Two–Dimensional Array of High–Power Strained Quantum Well Lasers With $\lambda = 0.95\mu m$"; Jun. 26, 1989; Appl. Phys. Lett., vol. 54, No. 26, pp. 2637–2638.

* cited by examiner

*Primary Examiner*—Howard Weiss
*Assistant Examiner*—Hoa B. Trinh

(57) ABSTRACT

Light-emitting devices are described. One example of a light-emitting device includes a first barrier layer and a second barrier layer, and a quantum well layer located between the first and second barrier layers. The first and second barrier layers are composed of gallium arsenide, and the quantum well layer is composed of indium gallium arsenide nitride. A first layer is located between the quantum well layer and the first barrier layer. The first layer has a bandgap energy between that of the first barrier layer and that of the quantum well layer. Another example of a light-emitting device includes a quantum well and a carrier capture element adjacent the quantum well. The carrier capture element increases the effective carrier capture cross-section of the quantum well.

39 Claims, 10 Drawing Sheets

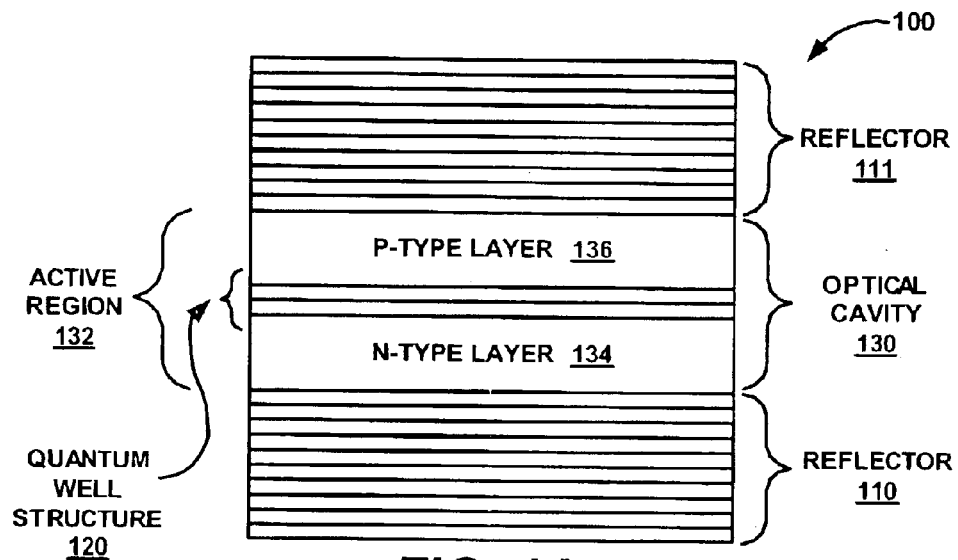
FIG. 1A
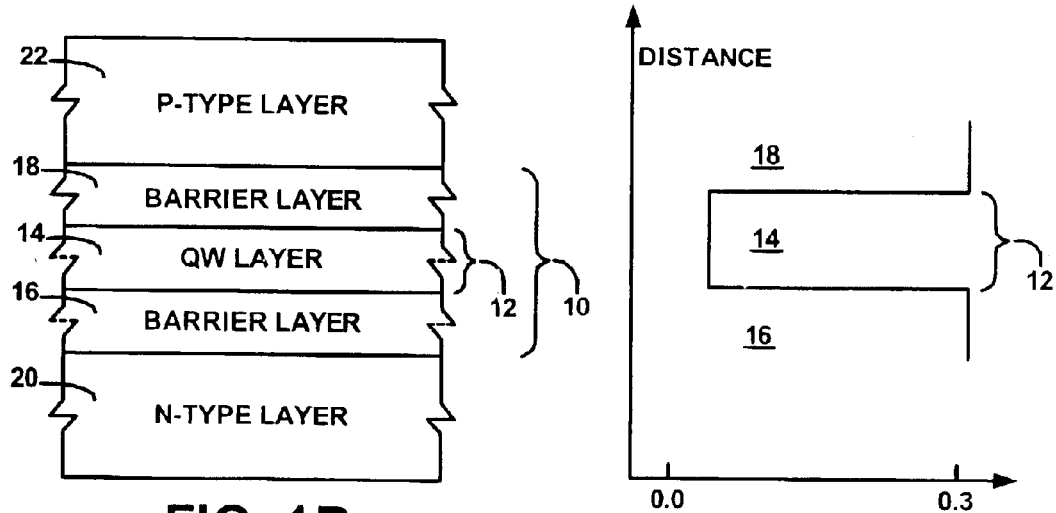
FIG. 1B
(Prior Art)
FIG. 1C
(Prior Art)

LIGHT-EMITTING DEVICE HAVING ELEMENT(S) FOR INCREASING THE EFFECTIVE CARRIER CAPTURE CROSS-SECTION OF QUANTUM WELLS

TECHNICAL FIELD

Embodiments of the present invention generally relate to light-emitting devices.

BACKGROUND ART

Light-emitting devices such as vertical-cavity surface-emitting lasers (VCSELs) are known in the art. In general, a VCSEL will employ one or more quantum wells to capture and confine carriers (electrons or holes), which subsequently radiatively recombine to generate light.

Contemporary VCSELs generate light having a wavelength in the range of approximately 850–980 nanometers (nm). The ability to generate light at longer wavelengths is advantageous, especially in optical communications, and development of VCSELs that generate light at wavelengths of 1200 nm or more is ongoing. One type of longer-wavelength VCSEL includes an active region that incorporates a quantum well structure composed of one or more quantum well layers of indium gallium arsenide nitride (InGaAsN) and a corresponding number of barrier layers of gallium arsenide (GaAs). The quantum well(s) defined by the quantum well structure have a depth on the order of 300 meV (millielectron volts).

A problem associated with the longer-wavelength VCSEL just described is that the characteristic temperature ($T_0$) and the differential quantum efficiency ($\eta$) are lower than expected, particularly under conditions of high carrier injection and especially considering the depth of the quantum wells.

Accordingly, solutions that increase the characteristic temperature and the differential quantum efficiency are sought.

DISCLOSURE OF THE INVENTION

Embodiments of the present invention pertain to light-emitting devices. One example of a light-emitting device includes a first barrier layer and a second barrier layer, and a quantum well layer located between the first and second barrier layers. The material of the first and second barrier layers includes gallium arsenide, and the material of the quantum well layer includes indium gallium arsenide nitride. A first layer is sandwiched between the quantum well layer and the first barrier layer. The material of the first layer has a bandgap energy between the bandgap energies of the first barrier layer and the quantum well layer.

Another example of a light-emitting device includes a quantum well and a carrier capture element located adjacent the quantum well. The carrier capture element increases the effective carrier capture cross-section of the quantum well. In one embodiment, the carrier capture element comprises an auxiliary quantum well. The auxiliary quantum well has a ground state energy substantially aligned with a non-ground energy state of the quantum well to provide resonant tunneling of carriers from the auxiliary quantum well to the quantum well. In another embodiment, the carrier capture element comprises a carrier reflector. The carrier reflector reflects carriers not captured by the quantum well back toward the quantum well.

A method for improving carrier capture in a light-emitting device is also described. According to the method, a number of carriers are captured in a quantum well of the light-emitting device. Additional carriers are confined in the quantum well using a carrier capture element such as those described above.

BRIEF DESCRIPTION OF THE DRAWINGS

The accompanying drawings, which are incorporated in and form a part of this specification, illustrate embodiments of the invention and, together with the description, serve to explain the principles of the invention. The drawings referred to in this description should not be understood as being drawn to scale except if specifically noted.

FIG. 1A is a cross-sectional view of a portion of a semiconductor laser exemplifying a light-emitting device upon which embodiments according to the invention are implemented.

FIG. 1B is a cross-sectional view of a conventional quantum well structure of a light-emitting device.

FIG. 1C is a graph showing the conduction band profile of the quantum well structure shown in FIG. 1B.

DETAILED DESCRIPTION OF THE INVENTION

Terminology and Overview

Figure 2B:
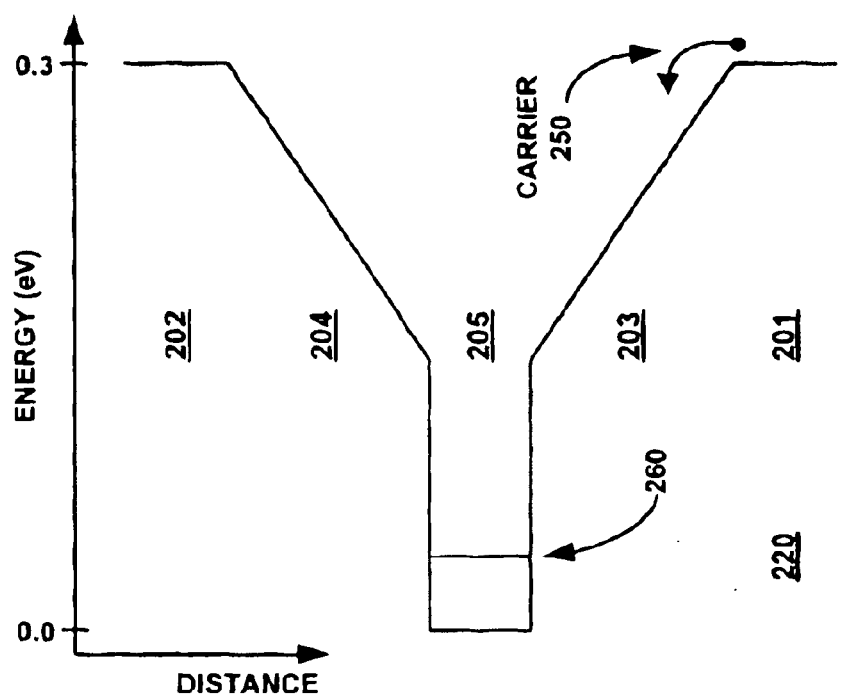
FIG. 2B is a graph showing the conduction band profile of the quantum well structure shown in FIG. 2A.

FIG. 1A is a cross-sectional view of a portion of an embodiment of a light-emitting device 100 in accordance with the invention. In the example shown, light-emitting device 100 is a vertical-cavity surface-emitting laser (VCSEL). More specifically, light-emitting device 100 is a long-wavelength VCSEL that generates light at a wavelength of 1200 nanometers (nm) or more.

Light-emitting device 100 includes a first reflector 110 and a second reflector 111. Reflectors 110 and 111 are also referred to as mirrors. Typically, first and second reflectors 110 and 111 are distributed Bragg reflectors (DBRs).

First reflector 110 and second reflector 111 collectively define optical cavity 130. Located in optical cavity 130 is active region 132. Active region 132 is composed of quantum well structure 120 sandwiched between n-type layer 134 and p-type layer 136. Typically, a quantum well structure defines between one and five quantum wells. However, the present invention is not limited to a quantum well structure that defines that number of quantum wells.

N-type layer 134 and p-type layer 136 inject electrons and holes (collectively referred to as "carriers"), respectively, into quantum well structure 120. A hole is a bond missing an electron. Holes are capable of moving in a semiconductor material but are typically less mobile than electrons. The carriers are captured by and are confined in the one or more of the quantum wells defined by the quantum well structure 120. The electrons and holes confined in the quantum wells radiatively recombine to generate light.

The VCSEL just described is an example of a light-emitting device in accordance with the invention. However, the invention is not limited to VCSELs. Embodiments of the invention are applicable to other types of: light-emitting devices such as, but not limited to, edge-emitting lasers and the optical gain medium of an electrically-pumped semiconductor external cavity laser.

As noted above, the active region of a light-emitting device such as a semiconductor laser includes a quantum well structure that defines a number of quantum wells. FIG. 1B is a cross-sectional view of a conventional quantum well structure 10 of a light-emitting device. The quantum well structure 10 is composed of one or more quantum well layers of a low bandgap material interleaved between a corresponding number of barrier layers of a higher bandgap material. A quantum well structure composed of N quantum well layers has N+1 barrier layers. In the example shown in FIG. 1B, quantum well structure 10 defines a single quantum well 12 and is composed of quantum well layer 14 sandwiched between barrier layers 16 and 18. As noted above, typical quantum well structures define between one and five quantum wells, although quantum well structures that define more than five quantum wells are known. Quantum well structure 10 is sandwiched between n-type layer 20 and p-type layer 22.

FIG. 1C shows the conduction band profile of the quantum well structure 10 of FIG. 1B. The conduction band profile of FIG. 1C shows the variation of conduction band energy with distance in the thickness direction. The material of quantum well layer 14 has a lower bandgap than the material of barrier layers 16 and 18. In the example shown, the conduction band energy of the material of the quantum well layer is less than that of that of the material of the barrier layers. The lower conduction band energy of the quantum well layer 14 relative to that of the barrier layers 16 and 18 defines quantum well 12. In the example shown, the conduction band energy changes abruptly at the interfaces of the quantum well layer 14 with the barrier layers 16 and 18.

During operation of a light-emitting device incorporating quantum well structure 10, electrons and holes are injected into the quantum well structure from n-type layer 20 and p-type layer 22, respectively. A fraction of the carriers injected into the quantum well structure 10 is captured by and confined in quantum well 12. The electrons and holes confined in the quantum well 12 recombine to generate light. The light generated by this recombination is emitted by the light-emitting device.

The invention is based on the inventors' realization that the low characteristic temperature ($T_0$) and low differential quantum efficiency ($\eta$) of a conventional long-wavelength light-emitting device are perhaps attributable to conventional quantum well structures having an inadequate carrier capture cross-section. As a result, a conventional quantum well structure captures a less than expected fraction of the carriers injected into it. Embodiments of the invention are directed to increasing carrier capture in the quantum wells of light-emitting devices. An increase in carrier capture in the quantum wells translates to an increase in $T_0$ and $\eta$ of a light-emitting device and lower threshold current.

In some embodiments of the invention, the effective carrier capture cross-section of a quantum well is increased by an additional layer located between the quantum well layer and at least one of the adjacent barrier layers. The material of the additional layer includes the same elements as the material of the barrier layers, but also includes an additional element that, in general, decreases the bandgap energy of the additional layer relative to the barrier layers. Such embodiments are described further in conjunction with FIGS. 2A, 2B, 3A, 3B, 4A and 4B.

In other embodiments, the effective carrier capture cross-section of a quantum well is increased by one or more auxiliary quantum wells located on one or both sides of the quantum well, which is sometimes referred to herein as the primary quantum well. Carriers captured by the auxiliary quantum wells are transported to the primary quantum well by resonant tunneling. Such embodiments are described further in conjunction with FIGS. 5A, 5B, 6A, 6B, 7A and 7B.

In yet other embodiments, the effective carrier capture cross-section of a quantum well is increased by a carrier reflector located on one side or the other of the quantum well. The carrier reflector reflects carriers not captured by the quantum well back toward the quantum well. Such embodiments are described further in conjunction with FIGS. 8A, 8B, 9A, 9B and 9C. Still other embodiments use combinations of the embodiments described above.

Embodiments Having a Layer Between a Quantum Well Layer and a Barrier Layer

As mentioned above, in some embodiments of the invention, the effective carrier capture cross-section of a quantum well is increased by an additional layer located between the quantum well layer and at least one of the adjacent barrier layers. The material of the additional layer includes the same elements as the material of the barrier layers, but also includes an additional element that, in general, decreases the bandgap energy of the additional layer relative to the barrier layers.

Figure 2A:
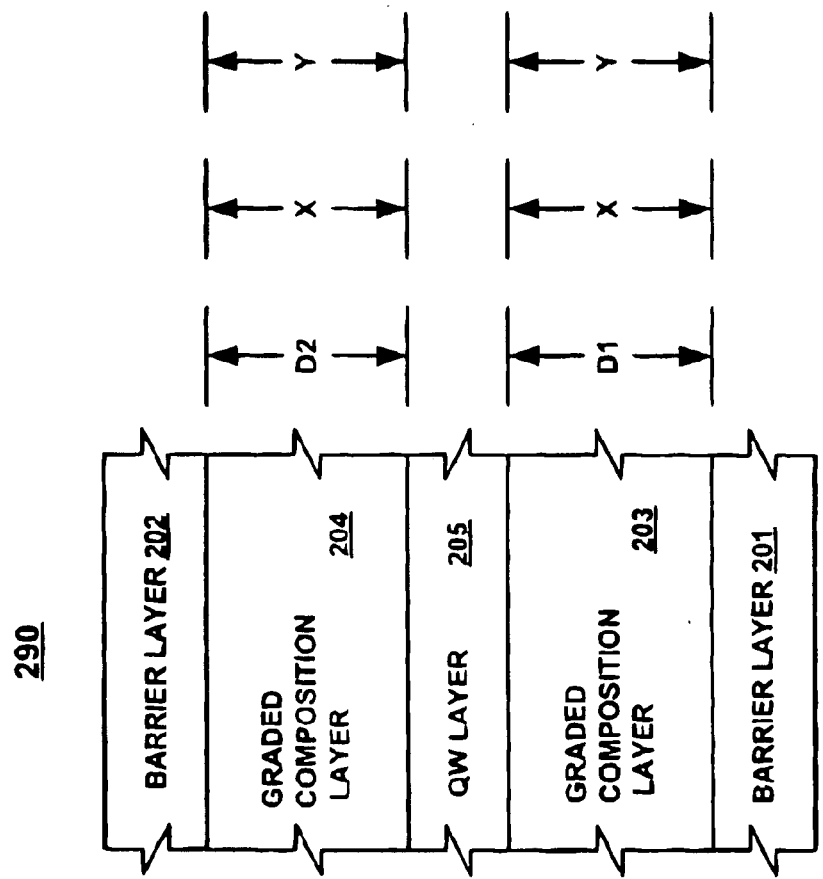
FIG. 2A is a cross-sectional view of a first embodiment of a quantum well structure of a light-emitting device according to the invention.

FIG. 2A is a cross-sectional view of a first embodiment of a quantum well structure 290 of a light-emitting device according to the invention. FIG. 2B is a graph showing the conduction band profile 220 of the quantum well structure shown in FIG. 2A.

Turning first to FIG. 2A, quantum well structure 290 is composed of, in order, barrier layer 201, graded-composition layer 203, quantum well layer 205, graded-composition layer 204 and barrier layer 202. Quantum well layer 205 is a layer of a semiconductor material that has a relatively low bandgap energy. Barrier layers 201 and 202 are each a layer of a semiconductor material and have a higher bandgap energy than that of the quantum well layer 205.

Graded-composition layers 203 and 204 are each a layer of a semiconductor material whose composition is not uniform through the thickness of the layer. The graded-composition layers 203 and 204 have a thickness of D1 and D2, respectively. The thickness D1 and the thickness D2 can be substantially equal, or they can be different.

At the respective interfaces of the graded-composition layers 203 and 204 and the barrier layers 201 and 202, the material of the graded-composition layers 203 and 204 has a maximum bandgap energy similar to that of the material of the adjacent barrier layer. The bandgap energy of the material of the graded-composition layers 203 and 204 progressively decreases as the distance from the quantum well layer 205 decreases. The bandgap energy of the material of the graded-composition layers 203 and 204 reaches a minimum at the respective interfaces of these layers with the quantum well layer 205. Note that the minimum bandgap energy at one interface can be different than the minimum bandgap energy at the other interface. That is, the minimum bandgap energy at the interface of graded-composition layer 203 and quantum well layer 205 can be different than the minimum bandgap energy at the interface of graded-composition layer 204 and quantum well layer 205.

The material of the graded-composition layers 203 and 204 includes the same elements as the barrier layers 201 and 202, but includes another element that reduces the bandgap energy of the graded-composition layers 203 and 204 relative to that of the barrier layers 201 and 202. In the present embodiment, the fraction of the additional element in the graded-composition layers 203 and 204 is progressively increased in the direction toward quantum well layer 205, resulting in a reduction in the bandgap energy of the graded-composition layers 203 and 204 as the distance to the quantum well layer 205 is reduced.

The graded-composition layers 203 and 204 increase the effective carrier capture cross-section of quantum well structure 290. The capture of carriers in a quantum well involves the relaxation of the carrier's energy from its energy at the barrier layers 201 and 202 to the ground state energy, indicated by line 260 of FIG. 2B, of the quantum well layer 205. This relaxation involves multiple steps, each of which involves a decrease in carrier energy. For a deep quantum well, more steps are involved. The grading of the additional element in the graded-composition layers 203 and 204 allows a more gradual relaxation of the carrier's energy, which translates to an increased probability of carrier capture.

Continuing with reference to FIG. 2A, in one embodiment, the material of quantum well layer 205 is indium gallium arsenide nitride (InGaAsN), and the material of each of the barrier layers 201 and 202 is gallium arsenide (GaAs). In a first example, the material of each of the graded-composition layers 203 and 204 is gallium arsenide nitride ($GaAs_{1-x}N_x$), in which the nitrogen fraction x varies through the thickness of the layer. Specifically, the nitrogen fraction x progressively decreases with increasing distance from the quantum well layer 205. In one example, the nitrogen fraction is about zero at the interface of graded-composition layer 203 with barrier layer 201 and at the interface of graded-composition layer 204 with barrier layer 202. The nitrogen fraction increases progressively to approximately one percent at the respective interfaces of graded-composition layers 203 and 204 and quantum well layer 205. Here, and below, the fraction of the additional element (in this example, nitrogen) is the ratio of the concentration of nitrogen atoms in the material to the concentration of all Group V atoms (nitrogen, phosphorus, arsenic, antimony, etc.) in the material. For example, a nitrogen fraction of one percent means that, on average, in every 100 Group V atoms in the material there is one atom of nitrogen. For $GaAs_{0.99}N_{0.01}$ (GaAsN with a nitrogen fraction of 0.01 and an arsenic fraction of 0.99), of every 100 Group V atoms in the material, on average there is one atom of nitrogen and 99 atoms of arsenic.

Elements instead of nitrogen can be used to change the bandgap energy of graded-composition layers 203 and 204. In another example, the material of graded-composition layers 203 and 204 is indium gallium arsenide ($In_yGa_{1-y}As$), in which the indium fraction y progressively increases towards quantum well layer 205 from a minimum value at the barrier layers 201 and 202. In one example, the indium fraction is about zero at the interface of graded-composition layer 203 with barrier layer 201 and at the interface of graded-composition layer 204 with barrier layer 202. The indium fraction increases progressively to a range of approximately 10–20 percent at the respective interfaces of graded-composition layers 203 and 204 and quantum well layer 205.

An advantage provided by the use of GaAsN instead of InGaAs in graded-composition layers 203 and 204 is that GaAsN is tensile-strained while the InGaAsN of quantum well layer 205 is compressive-strained. Using GaAsN as the material of the graded-composition layers 203 and 204 provides strain relief between the quantum well layer 205 and the barrier layers 201 and 202. The thickness D1 and the thickness D2 of graded-composition layers 203 and 204, respectively, together with the maximum nitrogen or indium fraction, have an influence on the amount of strain relief provided by the graded-composition layers. The magnitudes of D1 and D2 also have an influence on the effective carrier capture cross-section of the quantum well structure 290. Increasing D1 and D2 will increase the effective carrier capture cross-section of the quantum well structure 290, but increasing D1 and D2 too much can result in too much relaxation of the material in quantum well layer 205. The effective carrier capture cross-section is effectively limited by the degree of strain balancing to be achieved, and vice versa. The magnitudes of D1 and D2 are typically derived empirically and are a matter of design choice. In one embodiment, D1 and D2 are in the range 10–20 nm. However, the invention is not so limited, and thicknesses outside the range of 10–20 nm can be used.

The nitrogen fraction x and the indium fraction y can be greater than the values stated above. That is, for example, fractions of nitrogen greater than 0.01 can be used, and fractions of indium greater than 0.10–0.20 can be used. The maximum fraction in one uniform composition layer can be different from that of another uniform composition layer. Also, the fraction x or y can change in a linear fashion or in a non-linear fashion as a function of the distance from quantum well layer 205.

Turning now to the conduction band profile 220 shown in FIG. 2B, in one embodiment, carrier 250 is an electron. While described for an electron, the discussion and illustrations can be extended to analogous structures for more efficient hole capture. With reference also to FIG. 2A, the conduction band energy of the quantum well structure 290 remains at a relatively constant, higher value through the thicknesses of barrier layers 201 and 202, reduces progressively through the thicknesses of the graded-composition layers 203 and 204, and then drops to a minimum, relatively constant value in quantum well layer 205. The material of quantum well layer 205 is characterized by a ground state energy 260. In the example described, quantum well structure 290 defines a quantum well having an overall "depth" of about 300 millielectron volts (meV). This depth is the same as that of the conventional quantum well structure described with reference to FIGS. 1B and 1C. However, according to the embodiments of the invention described above, quantum well structure 290 incorporates the graded-composition layers 203 and 204 to increase carrier capture.

The conduction band profile 220 of quantum well structure 290 is essentially symmetrical in shape about the quantum well layer 205. The symmetry of the conduction band profile 220 is a consequence of the symmetry in composition of the graded-composition layers 203 and 204. In the example shown in FIGS. 2A and 2B, the nitrogen fraction x or indium fraction y changes linearly with distance from quantum well layer 205 in graded-composition layers 203 and 204, and D1 and D2 are approximately the same. However, as discussed above, the invention is not limited to this example. Alternatively, the nitrogen or indium fraction in the graded-composition layers can change non-linearly with the distance from the quantum well layer, and/or the magnitudes of D1 and D2 can be different. The shape of the conduction band profile of the graded-composition layers depends on the way in which the nitrogen or indium fraction changes with distance from the quantum well layer in the graded-composition layers 203 and 204. The "slope" of the conduction band profile through the graded-composition layers 203 and 204 depends, at least in part, on the magnitudes of D1 and D2 and on the composition of layers 203 and 204.

Quantum well structure 290 is described above with reference to an example that defines a single quantum well. However, this is not critical to the invention. One of more structures may be stacked on the exemplified quantum well structure to define, respectively, one or more additional quantum wells. Each added structure is composed of, in order, an additional graded-composition layer, an additional quantum well layer, an additional graded-composition layer, and an additional barrier layer. Note that neighboring quantum well structures share a barrier layer, so that each added structure begins with the barrier layer of the neighboring structure.

Figure 3B:
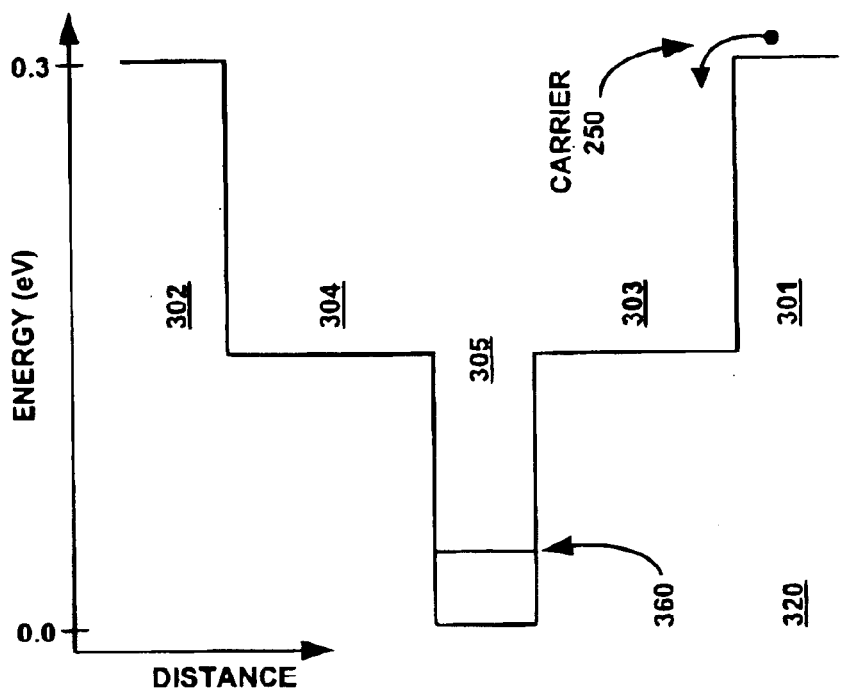
FIG. 3B is a graph showing the conduction band profile of the quantum well structure shown in FIG. 3A.
Figure 3A:
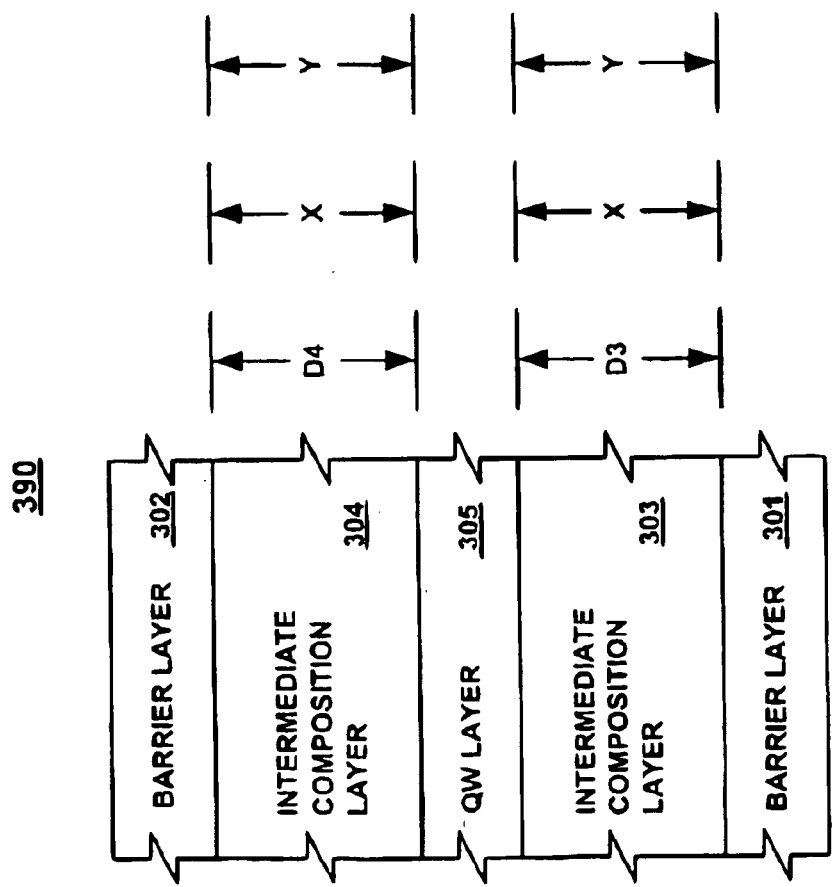
FIG. 3A is a cross-sectional view of a second embodiment of a quantum well structure of a light-emitting device according to the invention.

The discussion now turns to FIG. 3A, which is a cross-sectional view of a second embodiment of a quantum well structure 390 of a light-emitting device according to the invention. FIG. 3B is a graph showing the conduction band profile 320 of the quantum well structure shown in FIG. 3A.

Turning first to FIG. 3A, quantum well structure 390 is composed of, in order, barrier layer 301, intermediate composition layer 303, quantum well layer 305, intermediate composition layer 304 and barrier layer 302. Quantum well layer 305 is a layer of a semiconductor material that has a relatively low bandgap energy. Barrier layers 301 and 302 are each a layer of a semiconductor material and have a higher bandgap energy than that of the quantum well layer 305.

Intermediate composition layers 303 and 304 are each a layer of a semiconductor material whose composition remains relatively constant through the thickness of the layer. The material of the intermediate composition layers 303 and 304 has a bandgap energy that is between the bandgap energy of quantum well layer 305 and the bandgap energy of the barrier layers 301 and 302. The intermediate composition layers 303 and 304 have thicknesses D3 and D4, respectively. The thicknesses D3 and D4 can be substantially equal, or they can be different.

The material of the intermediate composition layers 303 and 304 includes the same elements as the barrier layers 301 and 302, but also includes another element that reduces the bandgap energy of the intermediate composition layers 303 and 304 relative to that of the barrier layers 301 and 302. In the present embodiment, the fraction of the additional element in the intermediate composition layers 303 and 304 is relatively constant.

The intermediate composition layers 303 and 304 increase the effective carrier capture cross-section of quantum well structure 390. The capture of carriers in a quantum well involves the relaxation of the carrier's energy from the energy at the barrier layers 301 and 302 to the ground state energy, indicated by line 360 in FIG. 3B, of the quantum well layer 305. The additional element in the intermediate composition layers 303 and 304 increases the relaxation of the carrier's energy, which translates to an increased probability of carrier capture.

Continuing with reference to FIG. 3A, in one embodiment, the material of quantum well layer 305 is InGaAsN and the material of each of the barrier layers 301 and 302 is GaAs. In a first example, the material of each of the intermediate composition layers 303 and 304 is $GaAs_{1-x}N_x$, in which the nitrogen fraction x remains relatively constant through the intermediate composition layers 303 and 304. In one example, the nitrogen fraction is about one percent, so that the material of the intermediate composition layers 303 and 304 is $GaAs_{0.99}N_{0.01}$. However, the nitrogen fraction x does not need to be the same in both intermediate composition layer 303 and intermediate composition layer 304. That is, the fraction of nitrogen in intermediate composition layer 303 can be different from the fraction of nitrogen in intermediate composition layer 304.

Elements other than nitrogen can be used to change the bandgap energy of intermediate composition layers 303 and 304. In another example, the material of intermediate composition layers 303 and 304 is $In_yGa_{1-y}As$, in which the indium fraction y remains relatively constant through the intermediate composition layers 303 and 304. In one example, the indium fraction is in the range of about 10–20 percent.

The nitrogen fraction x and the indium fraction y can be greater than the values stated above. That is, for example, fractions of nitrogen greater than 0.01 can be used, and fractions of indium greater than 0.10–0.20 can be used.

Turning now to the conduction band profile 320 shown in FIG. 3B, with reference also to FIG. 3A, the conduction band energy of the quantum well structure 390 remains at a relatively constant, higher value through the thicknesses of barrier layers 301 and 302, is reduced to a lower value that remains relatively constant through the thicknesses of the intermediate composition layers 303 and 304, and then drops to a minimum, relatively constant value in quantum well layer 305. The material of quantum well layer 305 is characterized by a ground state energy 360. In the example described, quantum well structure 390 defines a quantum well having an overall depth of about 300 meV. This depth is the same as that of the conventional quantum well structure described with reference to FIGS. 1B and 1C. However, according to the embodiments of the invention just described, the quantum well structure 390 incorporates the intermediate composition layers 303 and 304 to increase carrier capture.

The conduction band profile 320 of quantum well structure 390 is essentially symmetrical in shape about the quantum well layer 305. The symmetry of the conduction band profile 320 is a consequence of the symmetry in composition of the intermediate composition layers 303 and 304. In the example shown in FIGS. 3A and 3B, the nitrogen fraction x or indium fraction y is the same in intermediate composition layers 303 and 304, and the thicknesses D3 and D4 are approximately the same. However, as described above, the invention is not limited to this example.

Quantum well structure 390 is described above with reference to an example that defines a single quantum well. However, this is not critical to the invention. In a manner similar to that described above, one of more structures may be stacked on the exemplified quantum well structure to define, respectively, one or more additional quantum wells.

Figure 4B:
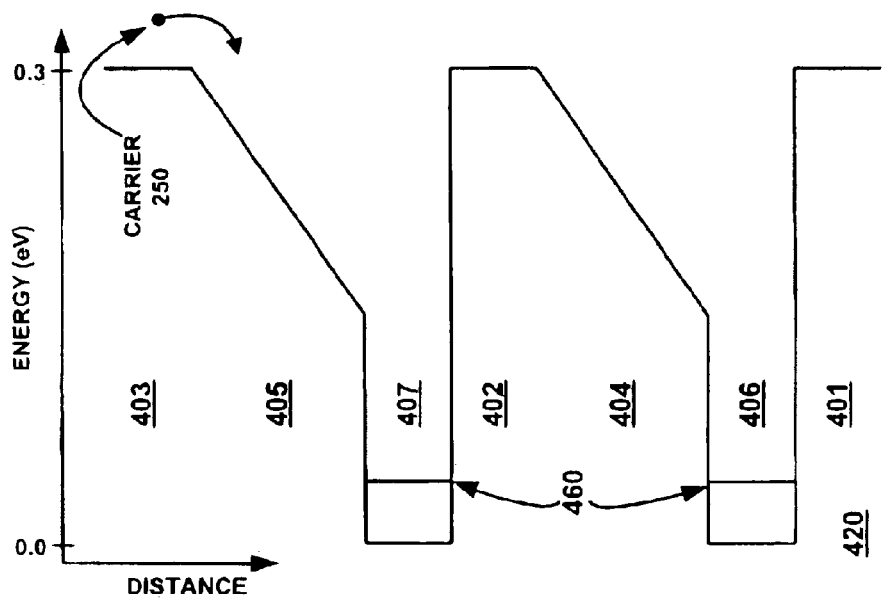
FIG. 4B is a graph showing the conduction band profile of the quantum well structure shown in FIG. 4A.
Figure 4A:
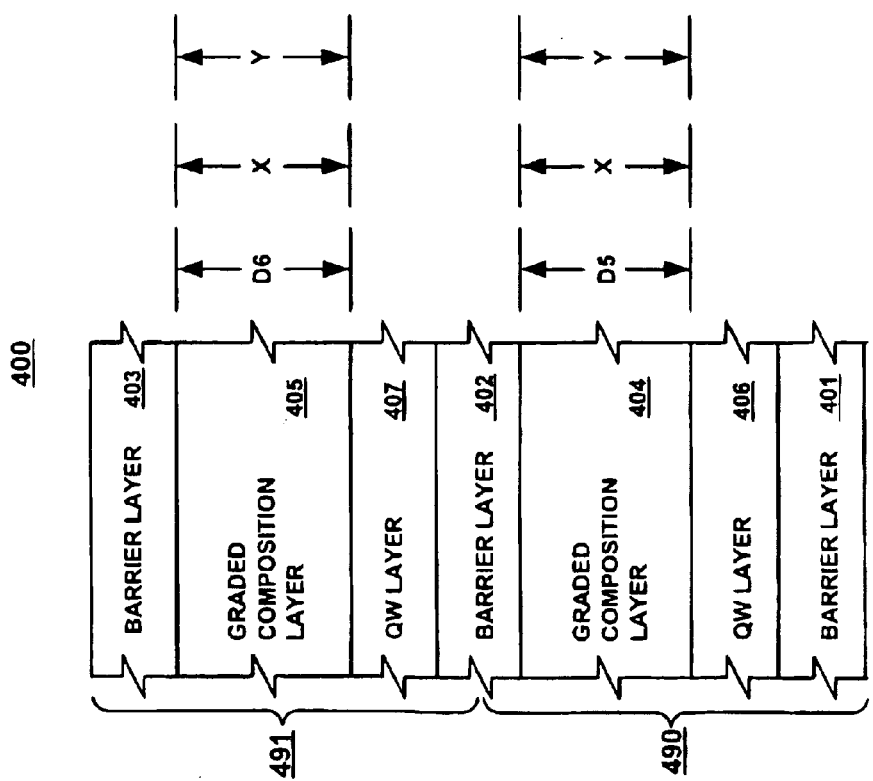
FIG. 4A is a cross-sectional view of a third embodiment of a quantum well structure of a light-emitting device according to the invention.

Reference is now made to FIG. 4A, which is a cross-sectional view of a third embodiment of a quantum well structure 400 of a light-emitting device according to the invention. FIG. 4B is a graph showing the conduction band profile 420 of the quantum well structure shown in FIG. 4A.

Referring first to FIG. 4A, quantum well structure 400 defines two quantum wells defined by quantum well structures 490 and 491. However, the present invention can be utilized with more or fewer than two quantum wells. Quantum well structure 490 is composed of, in order, barrier layer 401, quantum well layer 406, graded-composition layer 404, and barrier layer 402. Quantum well structure 491 is composed of, in order, barrier layer 402, quantum well layer 407, graded-composition layer 405, and barrier layer 403. Because quantum wells 490 and 491 are contiguous, they share the barrier layer 402. The graded-composition layers 404 and 405 have thicknesses D5 and D6, respectively. The thicknesses D5 and D6 can be substantially equal, or they can be different.

For purposes of brevity, the following discussion focuses primarily on quantum well structure 490. However, the discussion is extendible to quantum well structure 491. Quantum well layer 406 is a layer of a semiconductor material that has a relatively low bandgap energy. Barrier layers 401 and 402 are each a layer of a semiconductor material that has a higher bandgap energy than that of the quantum well layer 406.

In the present embodiment, graded-composition layer 404 is a layer of a semiconductor material whose composition is not uniform through the thickness of the layer. At the interface of the graded-composition layer 404 with the barrier layer 402, the material of the graded-composition layer 404 has a maximum bandgap energy similar to that of the material of the adjacent barrier layer. The bandgap energy of the material of the graded-composition layer 404 progressively decreases as the distance from the quantum well layer 406 decreases. The bandgap energy of the material of the graded-composition layer 404 reaches a minimum at the interface of this layer with the quantum well layer 406.

The material of the graded-composition layer 404 includes the same elements as the barrier layer 402, but with the addition of another element that reduces the bandgap energy of the graded-composition layer 404 relative to that of the barrier layer 402. In the present embodiment, the fraction of the additional element in the graded-composition layer 404 is progressively increased in the direction toward quantum well layer 406, resulting in a reduction in the bandgap energy of the graded-composition layer 404 as the distance to the quantum well layer 406 is reduced. The graded-composition layer 404 increases the effective carrier capture cross-section of quantum well structure 490, in a manner similar to that described above with reference to FIG. 2A.

In one embodiment, the material of quantum well layer 406 is InGaAsN and the material of each of the barrier layers 401 and 402 is GaAs. In a first example, the material of the graded-composition layer 404 is $GaAs_{1-x}N_x$, in which the nitrogen fraction x varies through the thickness of the layer. Specifically, the nitrogen fraction x progressively decreases with increasing distance from the quantum well layer 406. In one example, the nitrogen fraction is about zero at the interface of graded-composition layer 404 with barrier layer 402. The nitrogen fraction increases progressively to approximately one percent at the interface of graded-composition layer 404 with quantum well layer 406.

Elements other than nitrogen can be used to change the bandgap energy of graded-composition layer 404. In another example, the material of graded-composition layer 404 is $In_yGa_{1-y}As$, in which the indium fraction y progressively increases towards quantum well layer 406 from a minimum value at the barrier layer 402. In one example, the indium fraction is about zero at the interface of graded-composition layer 404 with barrier layer 402. The indium fraction increases progressively to a range of approximately 10–20 percent at the interface of graded-composition layer 404 and quantum well layer 406.

The nitrogen fraction x and the indium fraction y can be greater than the values stated above. That is, for example, fractions of nitrogen greater than 0.01 can be used, and fractions of indium greater than 0.10–0.20 can be used. In addition, the maximum nitrogen or indium fraction in graded-composition layer 404 can be different from that of graded-composition layer 405.

Thus, in contrast to the embodiments of FIGS. 2A and 3A, nitrogen or indium is incorporated into a barrier layer on only one side of a quantum well layer. In one implementation, the graded-composition layer 404 is on the side of quantum well layer 406 that is toward the source of the type of carrier for which capture is to be increased. That is, if electron capture is to be increased, then the graded-composition layer 404 is located on the side of quantum well layer 406 that is toward the electron source, e.g., the region 134 of n-type material; refer to FIG. 1A. If hole capture is to be increased, then the graded-composition layer 404 is located on the side of quantum well layer 406 that is toward the source of holes, e.g., the region 136 of p-type material; refer to FIG. 1A.

Turning now to FIG. 4B, with reference also to FIG. 4A, the conduction band profile 420 of quantum well structure 490 is asymmetrical in shape about the quantum well layer 406. This asymmetry is a consequence of the different compositions of the layers neighboring the quantum well layer 406 (e.g., the graded-composition layer 404 and the barrier layer 401), as just described.

The conduction band energy of the quantum well structure 490 remains at a relatively constant, higher value through the thickness of barrier layer 402, reduces progressively through the thickness of the graded-composition layer 404, and then drops to a minimum, relatively constant value in quantum well layer 406. The material of quantum well layer 406 is characterized by a ground state energy 460. In the example described, quantum well structure 490 defines a quantum well having an overall depth of about 300 meV. This depth is the same as that of the conventional quantum well structure described with reference to FIGS. 1B and 1C. However, as described above, the quantum well structure 490 incorporates the uniform composition layer 404 to increase carrier capture.

Quantum well structures 490 and 491 of FIG. 4A are described above with reference to an example in which the nitrogen or indium fraction is graded in graded-composition layer 404. Alternatively, a uniform fraction of nitrogen or indium is included in one or both of the graded-composition layers 404 and 405, in a manner similar to that described above in conjunction with FIG. 3A.

In addition, the features of the various embodiments described above can be used alone or in combination. For example, various combinations of the quantum well structures described in conjunction with FIGS. 2A, 3A and 4A can be used in a light-emitting device according to the invention.

Embodiments Having a Carrier Capture Element Comprising One or More Auxiliary Quantum Wells In some embodiments of the invention, the effective carrier capture cross-section of a quantum well is increased by one or more auxiliary quantum wells located on one or both sides of the quantum well, which is sometimes referred to herein as the primary quantum well. Carriers captured by the auxiliary quantum wells are transported to the primary quantum well by resonant tunneling.

Figure 5B:
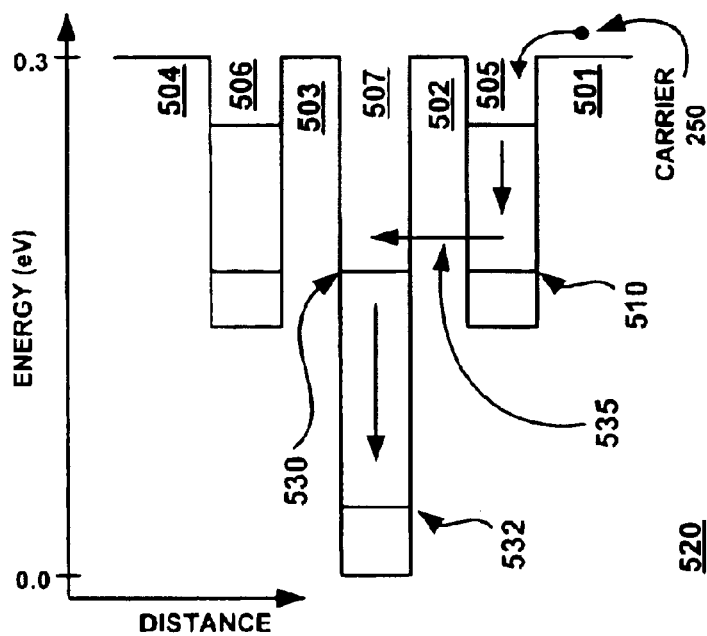
FIG. 5B is a graph showing the conduction band profile of the quantum well structure shown in FIG. 5A.
Figure 5A:
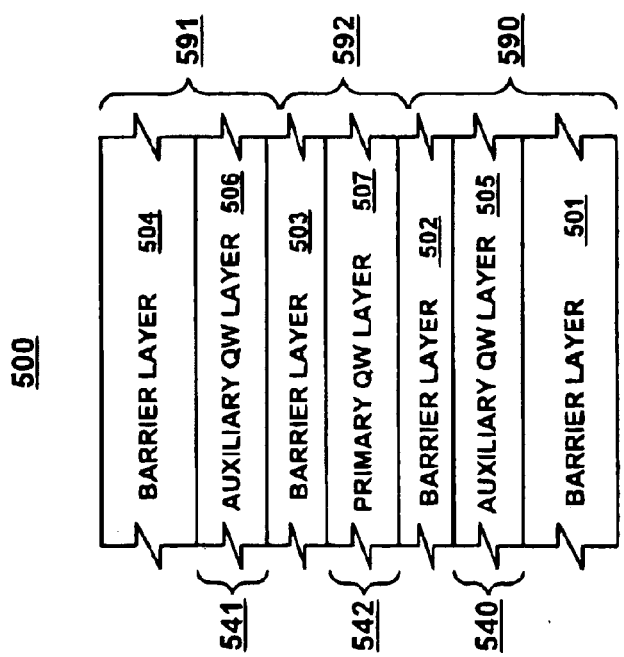
FIG. 5A is a cross-sectional view of a first embodiment of a quantum well structure that includes primary and auxiliary quantum wells in a light-emitting device according to the invention.

FIG. 5A is a cross-sectional view of a first embodiment of a quantum well structure 500 that includes auxiliary quantum wells in a light-emitting device according to the invention. FIG. 5B is a graph showing the conduction band profile 520 of the quantum well structure 500 shown in FIG. 5A.

With reference first to FIG. 5A, quantum well structure 500 includes, in order, a quantum well 540 defined by quantum well structure 590, a quantum well 542 defined by quantum well structure 592, and a quantum well 541 defined by quantum well structure 591. For clarity in the discussion below, the quantum well structures 590 and 591 are referred to as "auxiliary quantum well structures" and the quantum well structure 592 is referred to as a "primary quantum well structure." Similarly, quantum wells 540 and 542 are referred to as "auxiliary quantum wells" and quantum well 541 is referred to as a "primary quantum well." An auxiliary quantum well structure or auxiliary quantum well is also referred to herein as a carrier capture element. Carriers captured by the auxiliary quantum wells are transported to the primary quantum well by resonant tunneling.

Auxiliary quantum well structure 590 is composed of, in order, barrier layer 501, auxiliary quantum well layer 505, and barrier layer 502. Auxiliary quantum well structure 591 is composed of, in order, barrier layer 503, auxiliary quantum well layer 506, and barrier layer 504. Primary quantum well structure 592 is composed of, in order, barrier layer 502, primary quantum well layer 507, and barrier layer 503.

Primary quantum well layer 507 is a layer of a semiconductor material that has a relatively low bandgap energy. Barrier layers 501, 502, 503 and 504 are each a layer of a semiconductor material that has a higher bandgap energy than that of the auxiliary quantum well layers 505 and 506 and the primary quantum well layer 507. Auxiliary quantum well layers 505 and 506 are each a layer of a semiconductor material that has a bandgap energy between the bandgap energy of the barrier layers 501 and 504 and the bandgap energy of primary quantum well layer 507.

In one embodiment, the material of barrier layers 501, 502, 503 and 504 is GaAs, and the material of primary quantum well layer 507 is InGaAsN. In a first example, the material of auxiliary quantum well layers 505 and 506 is GaAsN. In another example, the material of auxiliary quantum well layers 505 and 506 is InGaAs. However, the auxiliary quantum well layers 505 and 506 do not need to be identical. The auxiliary quantum well layers 505 and 506 can use different materials; that is, for example, auxiliary quantum well layers 505 can use nitrogen and auxiliary quantum well layers 506 can use indium. Also, the auxiliary quantum well layers 505 and 506 can include different fractions of nitrogen or indium; that is, for example, if nitrogen is included, then auxiliary quantum well layers 505 can include a first fraction of nitrogen and auxiliary quantum well layers 506 can include a different fraction of nitrogen. As such, the auxiliary quantum well on the p-side of primary quantum well 592, facing p-type layer 136 of FIG. 1A, can be configured to enhance hole tunneling, and the auxiliary quantum well on the n-side of primary quantum well 592, facing n-type layer 134 of FIG. 1A, can be configured to enhance electron tunneling.

Using GaAsN instead of InGaAs in the auxiliary quantum well layers provides a measure of strain balancing, as described above. In addition to strain compensation, GaAsN offers other advantages. For example, there is no confined state for holes in a GaAsN quantum well, which increases the probability of electron tunneling. That is, the electrons captured in a GaAsN auxiliary quantum well will more likely tunnel into the primary quantum well 592 of FIG. 5A, instead of recombining in the auxiliary quantum well.

Reference is now made to the conduction band profile 520 of FIG. 5B, with reference also to FIG. 5A. For purposes of brevity, the following discussion focuses primarily on auxiliary quantum well structure 590 and primary quantum well structure 592. However, the discussion is extendible to auxiliary quantum well structure 591.

The material of auxiliary quantum well layer 505 is characterized by a ground state energy 510 that is substantially aligned with a higher, non-ground state energy 530 of the material of primary quantum well layer 507. As used herein, the term "aligned with" is synonymous with "resonant with" and "degenerate with." The non-ground energy state 530 is higher in energy than the ground state energy 532 of the material of primary quantum well layer 507. In other words, auxiliary quantum well 540 has a ground state energy 510 that is resonant with a non-ground state energy 530 of primary quantum well 542, and that is higher than the ground state energy 532 of primary quantum well 542.

In the example described, primary quantum well structure 592 defines a primary quantum well 542 having an overall depth of about 300 meV, and auxiliary quantum well structure 590 defines an auxiliary quantum well 540 that has an overall depth of less than 300 meV.

With the alignment of energy states 510 and 530, resonant tunneling 535 occurs from auxiliary quantum well 540 to primary quantum well 542. Accordingly, carriers such as carrier 250 that are captured by auxiliary quantum well 540 are efficiently transported from auxiliary quantum well 540 to the primary quantum well 542. Specifically, the carriers are transported from auxiliary quantum well layer 505 to primary quantum well layer 507. In a similar manner, carriers are also efficiently transported from auxiliary quantum well 541 to primary quantum well 542.

Thus, carriers captured by auxiliary quantum wells 540 and 541 are in essence added to those captured by primary quantum well 542. This increases the effective carrier capture cross-section of primary quantum well 542. The auxiliary quantum wells 540 and 541 work in concert with primary quantum well 542 to increase the effective carrier capture cross-section of primary quantum well 542. As such, the auxiliary quantum wells 540 and 541 are said to be "cooperatively disposed" with reference to the primary quantum well 542.

Figure 6B:
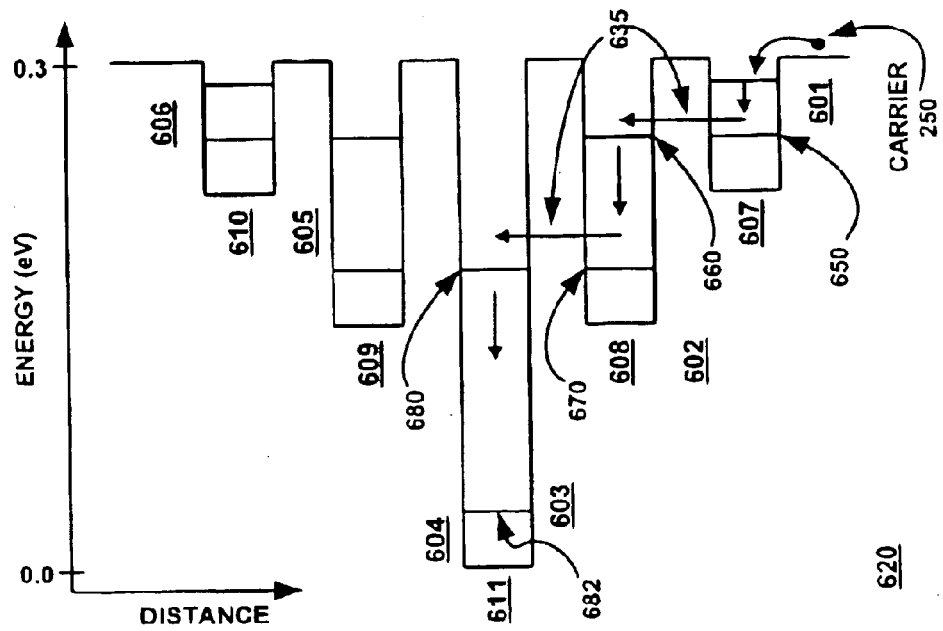
FIG. 6B is a graph showing the conduction band profile of the quantum well structure shown in FIG. 6A.
Figure 6A:
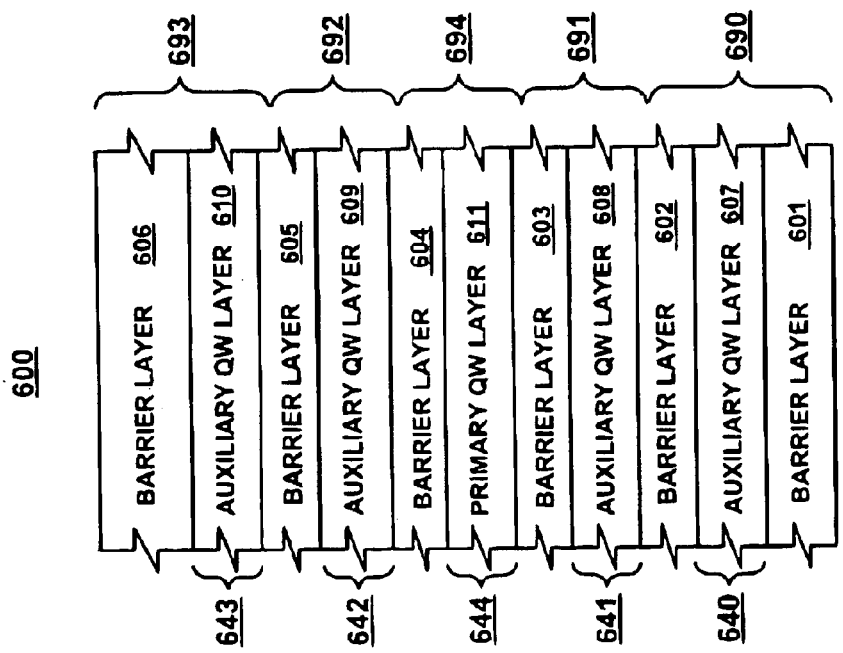
FIG. 6A is a cross-sectional view of a second embodiment of a quantum well structure that includes primary and auxiliary quantum wells in a light-emitting device according to the invention.

Turning now to FIG. 6A, a cross-sectional view of a second embodiment of a quantum well structure 600 incorporating auxiliary quantum wells in a light-emitting device according to the invention is shown. FIG. 6B is a graph showing the conduction band profile 620 of the quantum well structure 600 shown in FIG. 6A.

With reference first to FIG. 6A, quantum well structure 600 includes, in order, an auxiliary quantum well 640 defined by auxiliary quantum well structure 690, an auxiliary quantum well 641 defined by auxiliary quantum well structure 691, a primary quantum well 644 defined by primary quantum well structure 694, an auxiliary quantum well 642 defined by auxiliary quantum well structure 692, and an auxiliary quantum well 643 defined by auxiliary quantum well structure 693.

Auxiliary quantum well structure 690 is composed of, in order, barrier layer 601, auxiliary quantum well layer 607, and barrier layer 602. Auxiliary quantum well structure 691 is composed of, in order, barrier layer 602, auxiliary quantum well layer 608, and barrier layer 603. Auxiliary quantum well structure 692 is composed of, in order, barrier layer 604, auxiliary quantum well layer 609, and barrier layer 605. Auxiliary quantum well structure 693 is composed of, in order, barrier layer 605, auxiliary quantum well layer 610, and barrier layer 606. Primary quantum well structure 694 is composed of, in order, barrier layer 603, primary quantum well layer 611, and barrier layer 604.

Primary quantum well layer 611 is a layer of a semiconductor material that has a relatively low bandgap energy. Barrier layers 601–606 are each a layer of a semiconductor material that has a higher bandgap energy than that of the auxiliary quantum well layers 607–610 and the primary quantum well layer 611. Auxiliary quantum well layer 607 is a layer of a semiconductor material that has a bandgap energy between that of barrier layers 601 and 602 and that of auxiliary quantum well layer 608. Auxiliary quantum well layer 610 is a layer of a semiconductor material that has a bandgap energy between that of barrier layers 605 and 606 and that of auxiliary quantum well layer 609. Auxiliary quantum well layers 608 and 609 are each a layer of a semiconductor material that has a higher bandgap energy than that of primary quantum well layer 611.

In one embodiment, the material of barrier layers 601–606 is GaAs, and the material of primary quantum well layer 611 is InGaAsN. In a first example, the material of auxiliary quantum well layers 607–610 is GaAsN, with different nitrogen fractions. In another example, the material of auxiliary quantum well layers 607–610 is InGaAs, with different indium fractions. The relative magnitudes of the bandgap energies of the auxiliary quantum wells 640–643 are established by using different fractions of nitrogen or indium, for example, in the respective auxiliary quantum well layers 607–610. The materials of the auxiliary quantum well layers 607–610 do not need to be identical. That is, some auxiliary quantum well layers can use nitrogen, and others can use indium.

Reference is now made to the conduction band profile 620 of FIG. 6B, with reference also to FIG. 6A. For purposes of brevity, the following discussion focuses primarily on auxiliary quantum well structures 690 and 691 and primary quantum well structure 694. However, the discussion is extendible to auxiliary quantum well structures 692 and 693.

The material of auxiliary quantum well layer 607 is characterized by a ground state energy 650 that is substantially aligned with a higher, non-ground state energy 660 of the material of auxiliary quantum well layer 608. The material of auxiliary quantum well layer 608 is characterized by a ground state energy 670 that is substantially aligned with a higher, non-ground state energy 680 of the material of primary quantum well layer 611. The non-ground state energy 680 is higher in energy than the ground state energy 682 of the material of primary quantum well layer 611.

In the example described, primary quantum well structure 694 defines a primary quantum well 644 having an overall depth of about 300 meV, and auxiliary quantum well structures 690 and 691 define auxiliary quantum wells 640 and 641, respectively, that have overall depths of less than 300 meV. In addition, the auxiliary quantum well structure 690 defines an auxiliary quantum well 640 that has an overall depth less than that of auxiliary quantum well 641.

With the alignment of energy states 650 and 660, resonant tunneling 635 occurs from auxiliary quantum well 640 to auxiliary quantum well 641. With the alignment of energy states 660 and 680, resonant tunneling 635 also occurs from auxiliary quantum well 641 to primary quantum well 644. Accordingly, carriers such as carrier 250 that are captured by auxiliary quantum well 640 are efficiently transported from auxiliary quantum well 640 to auxiliary quantum well 641, and carriers are also efficiently transported from auxiliary quantum well 641 to the primary quantum well 644.

Thus, carriers captured by auxiliary quantum well 640 are transported to auxiliary quantum well 641 by resonant tunneling. These carriers, as well as those carriers captured by auxiliary quantum well 641, are in turn transported by resonant tunneling to primary quantum well 644. Auxiliary quantum wells 642 and 643 behave similarly. Carriers captured by auxiliary quantum wells 640–643 are in effect added to the carriers captured and confined by primary quantum well 644. As such, the effective carrier capture cross-section of primary quantum well 644 is increased.

Figure 7B:
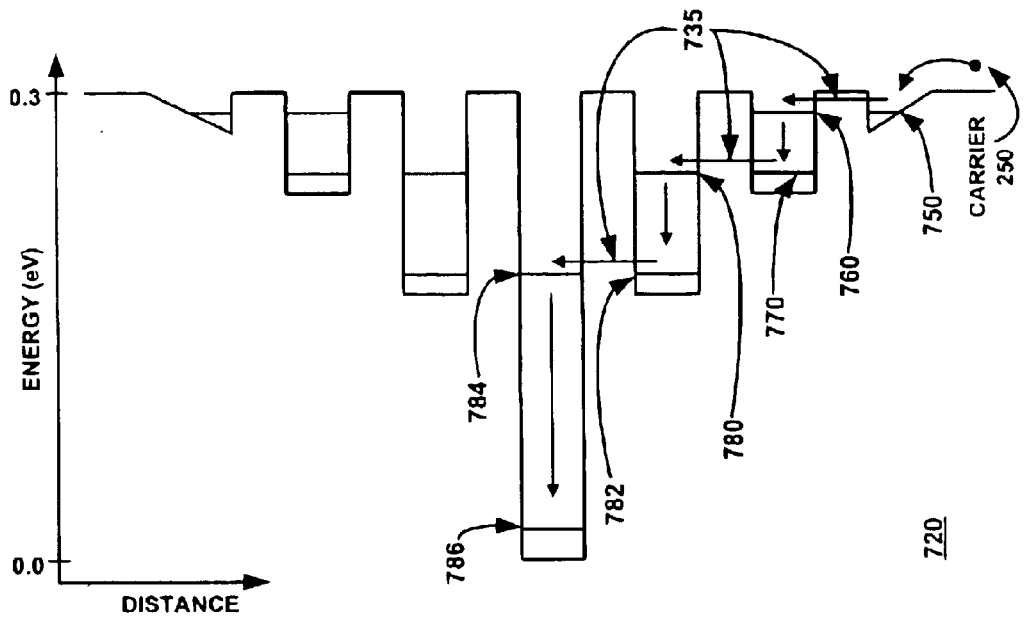
FIG. 7B is a graph showing the conduction band profile of the quantum well structure shown in FIG. 7A.
Figure 7A:
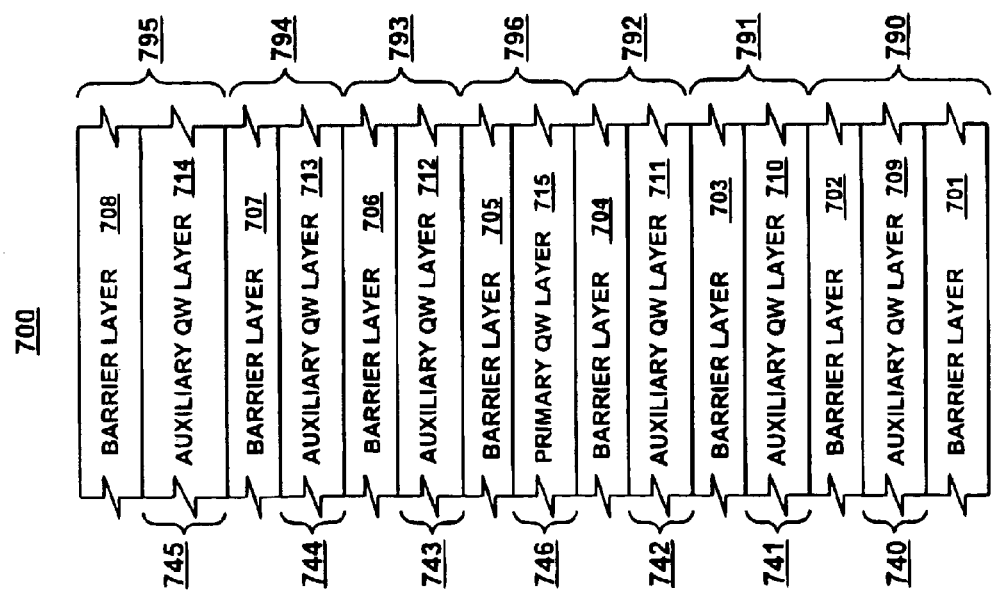
FIG. 7A is a cross-sectional view of a third embodiment of a quantum well structure that includes primary and auxiliary quantum wells in a light-emitting device according to the invention.

Turning now to FIG. 7A, a cross-sectional view of a third embodiment of a quantum well structure 700 incorporating auxiliary quantum wells in a light-emitting device according to the invention is shown. FIG. 7B is a graph showing the conduction band profile 720 of the quantum well structure 700 shown in FIG. 7A.

With reference first to FIG. 7A, quantum well structure 700 includes, in order, an auxiliary quantum well 740 defined by auxiliary quantum well structure 790, an auxiliary quantum well 741 defined by auxiliary quantum well structure 791, an auxiliary quantum well 742 defined by auxiliary quantum well structure 792, a primary quantum well 746 defined by primary quantum well structure 796, an auxiliary quantum well 743 defined by auxiliary quantum well structure 793, an auxiliary quantum well 744 defined by auxiliary quantum well structure 794, and an auxiliary quantum well 745 defined by auxiliary quantum well structure 795.

Auxiliary quantum well structure 790 is composed of, in order, barrier layer 701, auxiliary quantum well layer 709, and barrier layer 702. Auxiliary quantum well structure 791 is composed of, in order, barrier layer 702, auxiliary quantum well layer 710, and barrier layer 703. Auxiliary quantum well structure 792 is composed of, in order, barrier layer 703, auxiliary quantum well layer 711, and barrier layer 704. Auxiliary quantum well structure 793 is composed of, in order, barrier layer 705, auxiliary quantum well layer 712 and barrier layer 706. Auxiliary quantum well structure 794 is composed of, in order, barrier layer 706, auxiliary quantum well layer 713, and barrier layer 707. Auxiliary quantum well structure 795 is composed of, in order, barrier layer 707, auxiliary quantum well layer 714, and barrier layer 708. Primary quantum well structure 796 is composed of, in order, barrier layer 704, primary quantum well layer 715, and barrier layer 705.

Primary quantum well layer 715 is a layer of a semiconductor material that has a relatively low bandgap energy. Barrier layers 701–708 are each a layer of a semiconductor material that has a higher bandgap energy than that of the auxiliary quantum well layers 709–714 and the primary quantum well layer 715. Auxiliary quantum well layers 709 and 714 are each a layer of a semiconductor material that has a bandgap energy between that of, respectively, the barrier layers 701 and 708 and that of, respectively, auxiliary quantum well layers 710 and 713. Auxiliary quantum well layers 710 and 713 are each a layer of a semiconductor material that has a bandgap energy higher than that of, respectively, auxiliary quantum well layers 711 and 712. Auxiliary quantum well layers 711 and 712 are each a layer of a semiconductor material that has a bandgap energy higher than that of primary quantum well layer 715.

In one embodiment, the material of barrier layers 701–708 is GaAs, and the material of primary quantum well layer 715 is InGaAsN. In a first example, the material of auxiliary quantum well layers 709–714 is GaAsN, with different nitrogen fractions. In another example, the material of auxiliary quantum well layers 709–714 is InGaAs, with different indium fractions. The relative magnitudes of the bandgap energies of the auxiliary quantum wells 740–745 are established by using different fractions of nitrogen or indium, for example, in the respective auxiliary quantum well layers 709–714. The materials of the auxiliary quantum well layers 709–714 do not need to be identical. That is, some auxiliary quantum well layers can use nitrogen, and others can use indium.

Furthermore, in the example shown by FIG. 7A, the fraction of nitrogen or indium included in the auxiliary quantum well layers 709 and 714 is graded, with the fraction increasing in the direction toward primary quantum well 796, in a manner similar to that described above in conjunction with FIG. 2A. For instance, in the examples above, auxiliary quantum well layers 709 and 714 are described as being composed of GaAsN or InGaAs. As described in conjunction with FIG. 2A, the fraction of nitrogen or indium can be graded in auxiliary quantum well layers 709 and 714.

Reference is now made to the conduction band profile 720 of FIG. 7B, with reference also to FIG. 7A. For purposes of brevity, the following discussion focuses primarily on auxiliary quantum well structures 790–792 and primary quantum well structure 796. However, the discussion is extendible to auxiliary quantum well structures 793–795.

The material of auxiliary quantum well layer 709 is characterized by a ground state energy 750 that is substantially aligned with a higher, non-ground state energy 760 of the material of auxiliary quantum well layer 710. The material of auxiliary quantum well layer 710 is characterized by a ground state energy 770 that is substantially aligned with a higher, non-ground state energy 780 of the material of auxiliary quantum well layer 711. The material of auxiliary quantum well layer 711 is characterized by a ground state energy 782 that is substantially aligned with a higher, non-ground state energy 784 of the material of primary quantum well layer 715. The energy state 784 is higher in energy than the ground state energy 786 of the material of primary quantum well layer 715.

In the example described, primary quantum well structure 796 defines a primary quantum well 746 having an overall depth of about 300 meV, and auxiliary quantum well structures 790–792 define auxiliary quantum wells 740–742, respectively, that have overall depths of less than 300 meV. That is, primary quantum well 746 has the greatest depth. The auxiliary quantum well 742 has an overall depth less than that of primary quantum well 746; auxiliary quantum well 741 has a depth less than that of auxiliary quantum well 742; and auxiliary quantum well 740 as a depth less than that of auxiliary quantum well 741.

Grading the auxiliary quantum well layer 709 increases the effective carrier capture cross-section of that quantum well. With the alignment of energy states 750 and 760, resonant tunneling 735 occurs from auxiliary quantum well 740 to auxiliary quantum well 741. With the alignment of energy states 770 and 780, resonant tunneling 735 also occurs from auxiliary quantum well 741 to auxiliary quantum well 742. Furthermore, with the alignment of energy states 782 and 784, resonant tunneling 735 also occurs from auxiliary quantum well 742 to primary quantum well 746. Accordingly, carriers are efficiently transported from auxiliary quantum well 740 to auxiliary quantum well 741, from auxiliary quantum well 741 to auxiliary quantum well 742, and from auxiliary quantum well 742 to primary quantum well 746.

Thus, carriers captured by auxiliary quantum well 740 are transported to auxiliary quantum well 741 by resonant tunneling. These carriers, as well as those carriers captured by auxiliary quantum well 741, are in turn transported by resonant tunneling to auxiliary quantum well 742. These carriers, as well as those carriers captured by auxiliary quantum well 742, are in turn transported by resonant tunneling to primary quantum well 746. Auxiliary quantum wells 743–745 behave similarly. Carriers captured by auxiliary quantum wells 740–745 are in effect added to the carriers captured and confined by primary quantum well 746. As such, the effective carrier capture cross-section of primary quantum well 746 is increased.

The quantum well structures 500, 600 and 700 described according to FIGS. 5A, 6A and 7A, respectively, can also incorporate the features, or combinations of the features, of the quantum well structures described in conjunction with FIGS. 2A, 3A and 4A. For example, a graded or intermediate composition layer such as those described in conjunction with FIGS. 2A, 3A and 4A can be included adjacent, and on either or both sides of, any or all of the primary and auxiliary quantum well layers described by FIGS. 5A, 6A and 7A.

The quantum well structures 500, 600 and 700 of FIGS. 5A, 6A and 7A are described as having a same number of auxiliary quantum wells located on each side of the primary quantum well. The invention is not limited to such a symmetrical configuration. That is, the auxiliary quantum wells do not need to be symmetrically disposed about a primary quantum well. For example, in one embodiment, auxiliary quantum wells are situated only to one side of a primary quantum well. In another embodiment, a number of auxiliary quantum wells are located on one side of a primary quantum well, and a different number of auxiliary quantum wells are located on the other side of the primary quantum well. The distance between adjacent quantum well layers is selected to permit efficient resonant tunneling between adjacent quantum wells. Thus, the distance between pairs of adjacent quantum wells need not be uniform.

Embodiments Having a Carrier Capture Element Comprising a Carrier Reflector

In some embodiments of the invention, the effective carrier capture cross-section of a quantum well is increased by a carrier reflector located on one side or on both sides of the quantum well. The carrier reflector reflects carriers not captured by the quantum well back toward the quantum well.

Figure 8B:
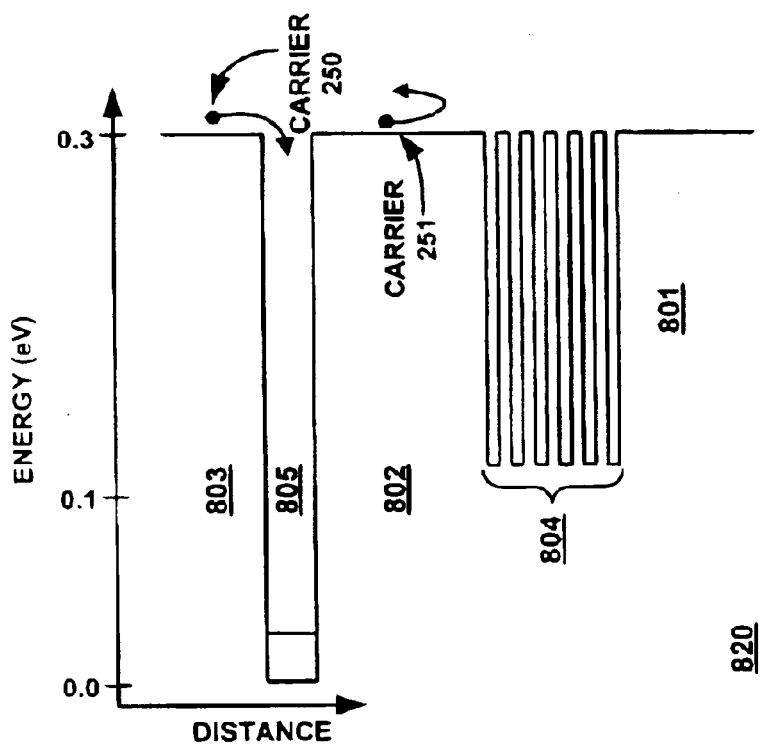
FIG. 8B is a graph showing the conduction band profile of the quantum well structure shown in FIG. 8A.
Figure 8A:
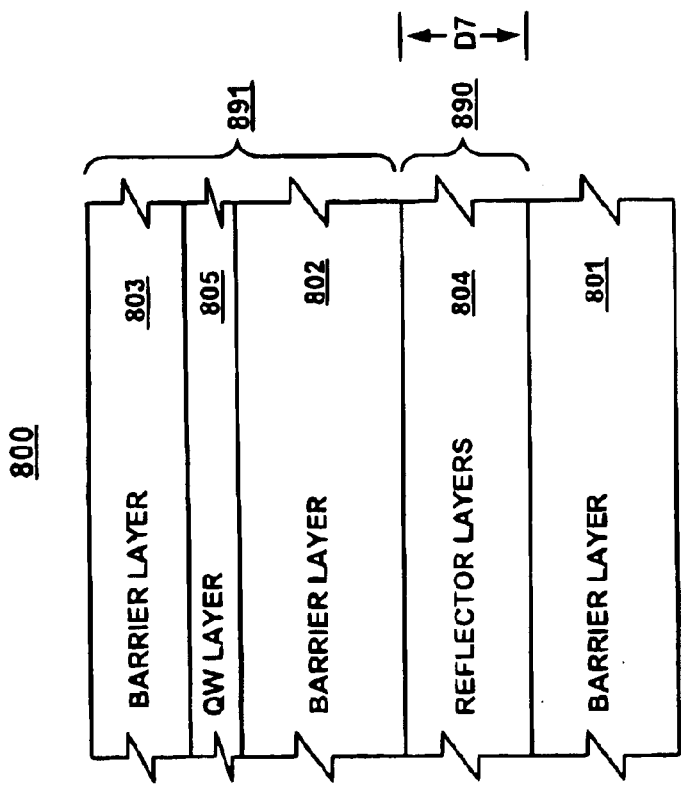
FIG. 8A is a cross-sectional view of an embodiment of a light-emitting device that includes a carrier reflector adjacent a quantum well structure according to the invention.

FIG. 8A is a cross-sectional view of an embodiment of a carrier reflector structure 890 in proximity to a quantum well structure 891 according to the invention. FIG. 8B is a graph showing the conduction band profile of the structure 800 shown in FIG. 8A.

With reference first to FIG. 8A, quantum well structure 891 includes, in order, a barrier layer 802, a quantum well layer 805, and a barrier layer 803. Quantum well layer 805 is a layer of a semiconductor material that has a relatively low bandgap energy, and barrier layers 802 and 803 are each a layer of a semiconductor material that has a bandgap energy higher than that of the quantum well layer 805.

Adjacent the barrier layer 802 is carrier reflector structure 890. Carrier reflector structure 890 includes, in order, barrier layer 801 and reflector layers 804. Barrier layer 801 is a layer of a semiconductor material that has a relatively high bandgap energy. Reflector layers 804 include alternating layers of a first semiconductor material and a second semiconductor material, one of which has a higher bandgap energy than the other.

The carrier reflector structure 890 is also referred to herein as a carrier capture element. The carrier reflector structure 890 is in addition to optical reflectors 110 and 111 of FIG. 1A.

Reflector structure 890 reflects carriers back toward the quantum well structure 891. To serve as an electron reflector, the reflector structure 890 is located on the side of quantum well structure 891 facing the region doped with p-type material, e.g., p-type layer 136 of FIG. 1A. To serve as a hole reflector, the reflector structure 890 is located on the side of quantum well 891 facing the region doped with n-type material, e.g., n-type layer 134 of FIG. 1A. It is recognized that the band offsets in the valence band and the effective masses are different for holes versus electrons. A reflector of holes is therefore dimensioned differently than a reflector of electrons. A reflector structure 890 can be located on both sides of the quantum well structure 891.

A reflector structure 890 is separated from the quantum well 891 structure by a distance sufficient to prevent carrier tunneling from quantum well structure 891 into the reflector structure 890. Reflector structure 890 is sized such that its overall thickness D7 is small enough that the carrier wave maintains coherence across the reflector structure 890. The thickness of each of the multiple layers that constitute reflector layers 804 is chosen to enhance the reflectivity of reflector structure 890 with respect to the respective carriers, as will be described in more detail in conjunction with FIGS. 9A, 9B and 9C.

As a carrier reflector, reflector structure 890 of FIG. 8A reflects carriers back toward the quantum well structure 891. Some carriers, e.g., carrier 250, are captured by quantum well structure 891. Some of the carriers not captured by quantum well structure 891, e.g., carrier 251, are reflected back toward the quantum well structure by reflector structure 890. This provides another opportunity for quantum well structure 891 to capture and confine the reflected carrier.

Accordingly, reflector structure 890 works in concert with quantum well structure 891 to increase the probability of carrier capture, increasing the effective carrier capture cross-section of quantum well structure 891. The reflector structure 890 is thus described as being cooperatively disposed relative to quantum well structure 891.

In one example, the barrier layers 801, 802 and 803 are composed of GaAs, and quantum well layer 805 is composed of InGaAsN. In this example, reflector layers 804 of reflector structure 890 are alternating layers of $GaAs_{0.99}N_{0.01}$ (a lower bandgap energy semiconductor material) and GaAs (a higher bandgap energy semiconductor material). Nitrogen fractions other than 0.01 can be used. Also, indium can be used instead of nitrogen, as previously described herein.

The structure 800 of FIG. 8A can also incorporate the features, or combinations of the features, of the quantum well structures described in conjunction with FIGS. 2A, 3A, 4A, 5A, 6A and 7A.

Turning now to the conduction profile 820 of FIG. 8B, quantum well structure 891 defines a quantum well having an overall depth of 300 meV. Reflector structure 890 includes alternating layers of a higher bandgap energy semiconductor material and a lower bandgap energy semiconductor material. In the present embodiment, there is a 200 meV conduction band offset between the layers of higher bandgap energy semiconductor material and the layers of lower bandgap energy semiconductor material in reflector structure 890.

Figure 9A:
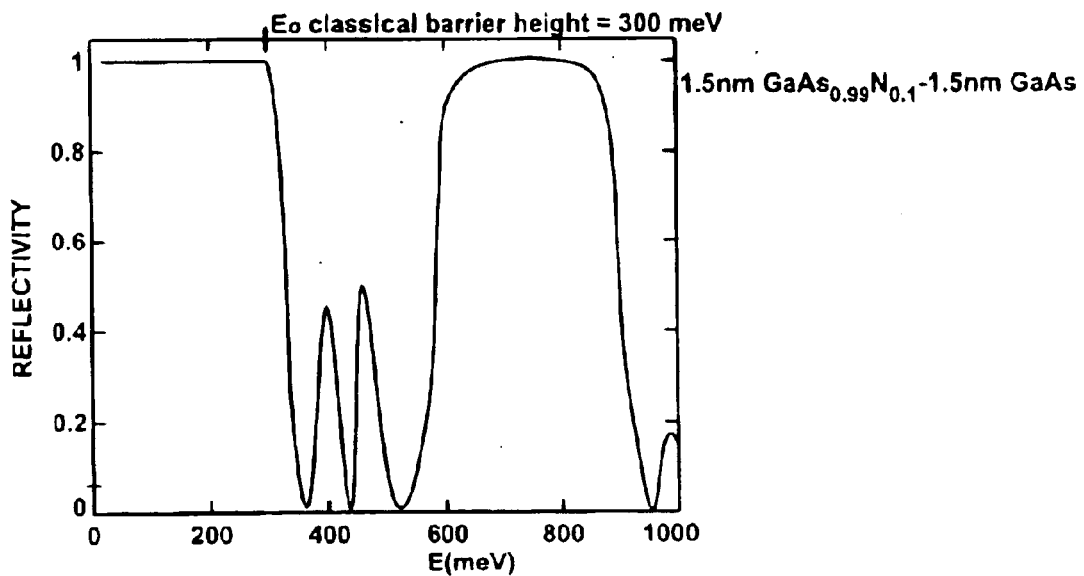
FIGS. 9A, 9B and 9C are graphs showing reflectivity spectra for different types of reflectors according to embodiments of the invention.
Figure 9B:
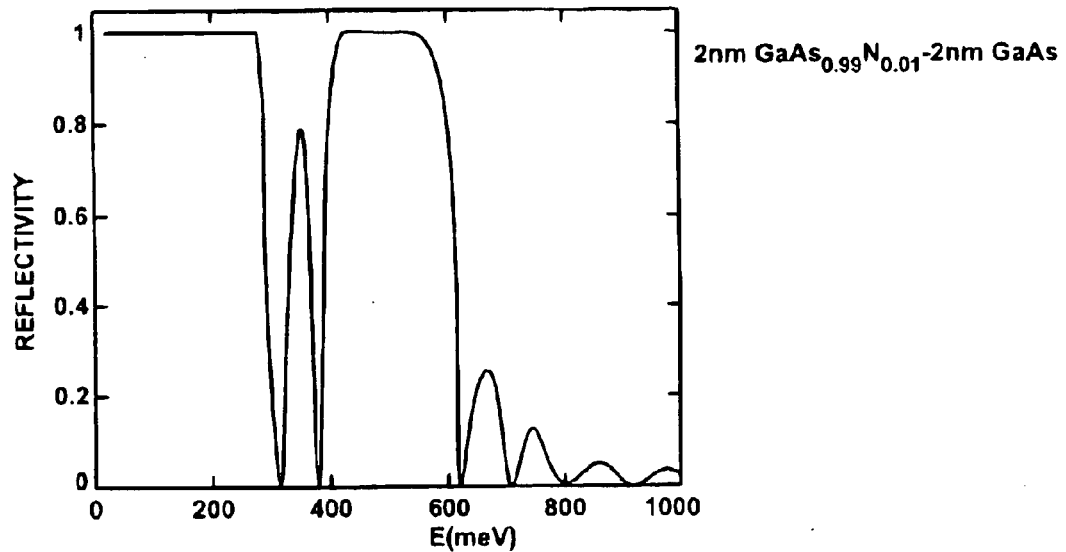
Figure 9C:
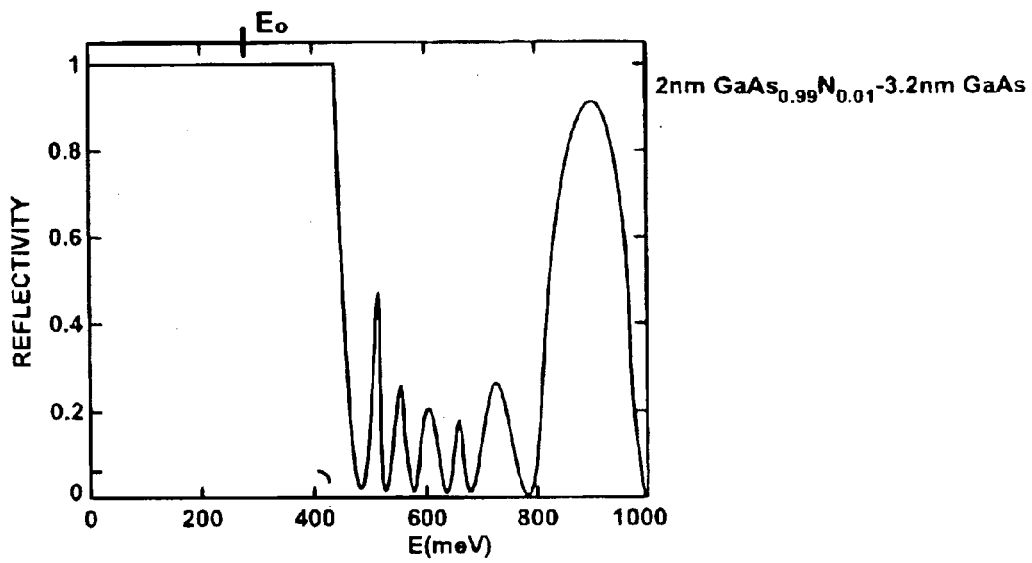

FIGS. 9A, 9B and 9C are graphs of electron reflectivity spectra for different embodiments of reflector structure 890 (FIG. 8A) according to the invention. With reference also to FIG. 8A, the reflectivity spectra of FIGS. 9A–9C are based on the quantum well structure 891 of FIG. 8A, having a depth of 300 meV, and the GaAsN and GaAs layers of the reflector structure 890 having a 200 meV conduction band offset. The reflectivity spectra of FIGS. 9A–9C are also based on electron effective mass ratios of 0.067 for GaAs and 0.10 for GaAsN.

FIG. 9A shows an electron reflectivity spectrum for an embodiment of a reflector structure composed of eight pairs of alternating layers of $GaAs_{0.99}N_{0.01}$ and GaAs. Each layer of the reflector structure has a thickness of about 1.5 nm. Here, the classical barrier height appears as an abrupt drop in reflectivity for an electron energy (E, in meV) greater than 300 meV. For electron energy values of approximately 600<E<800, the electron reflector produces a strong reflection.

FIG. 9B shows an electron reflectivity spectrum for an embodiment of a reflector structure composed of eight pairs of alternating layers of $GaAs_{0.99}N_{0.01}$ and GaAs in which each layer has a thickness of about two (2) nm. Here, the classical barrier height again appears as an abrupt drop in reflectivity for an electron energy (E, in meV) greater than 300 meV. For electron energy values of approximately 400<E<600, the electron reflector produces a strong reflection.

FIG. 9C shows an electron reflectivity spectrum for an embodiment of a reflector structure composed of eight pairs of alternating layers of $GaAs_{0.99}N_{0.01}$ and GaAs in which the GaAs layers have a thickness of about 3.2 nm while the GaAs$_{0.99}$N$_{0.01}$ layers have a thickness of about 2 nm. Here, there is a shift in the reflection spectrum, effectively increasing the barrier height from the classical value of 300 meV to an effective barrier height of approximately 450 meV.

Method for Improving Carrier Capture

Figure 10:
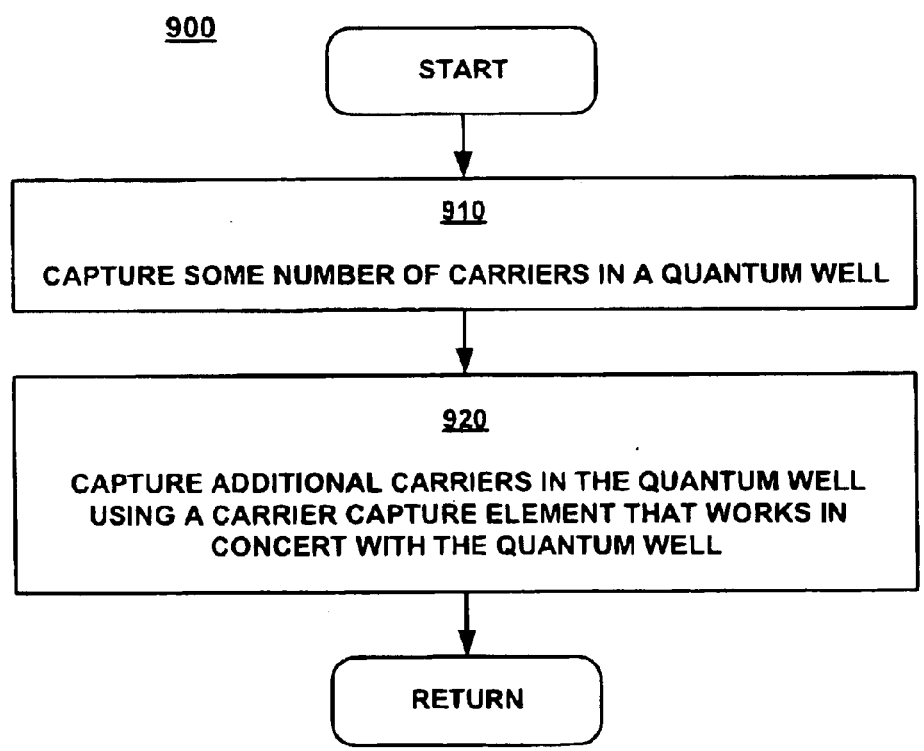
FIG. 10 is a flowchart illustrating an exemplary method for increasing carrier capture according to the invention.

FIG. 10 is a flowchart 900 of a method for improving carrier capture in a light-emitting device according to one embodiment of the present invention. Although specific operations are disclosed in flowchart 900, such operations are exemplary. That is, embodiments of the present invention are well suited to performing various other operations or variations of the operations recited in flowchart 900. It is appreciated that the operations in flowchart 900 can be performed in an order different than presented. Also, in some embodiments, not all of the operations in flowchart 900 are performed.

In block 910, in the present embodiment, a number of carriers are captured in a quantum well of the light-emitting device. In block 920, additional carriers are captured in the quantum well using a carrier capture element that performs in concert with the quantum well to increase the effective carrier capture cross-section of the quantum well.

In one embodiment, the carrier capture element includes a reflector proximate to the quantum well. The reflector reflects carriers not captured by the quantum well back toward the quantum well.

In another embodiment, the carrier capture element includes an auxiliary quantum well proximate to the quantum well. The auxiliary quantum well has a ground state energy substantially aligned with an energy state of the quantum well such that resonant tunneling of carriers from the auxiliary quantum well to the quantum well occurs.

In yet another embodiment, the light-emitting device includes a layer adjacent the quantum well, the layer comprising a material for increasing the effective carrier capture cross-section of the quantum well.

In summary, the present invention, in various embodiments, provides solutions that enhance carrier capture in the quantum wells of a light-emitting device.

Various embodiments of the present invention are thus described. While the present invention has been described in particular embodiments, it should be appreciated that the present invention should not be construed as limited by such embodiments, but rather construed according to the following claims.

What is claimed is:

1. A light-emitting device, comprising:
    a first barrier layer and a second barrier layer, said first and second barrier layers comprising gallium arsenide (GaAs);
    a quantum well layer sandwiched between said first and second barrier layers, said quantum well layer comprising indium gallium arsenide nitride (InGaAsN); and
    sandwiched between said quantum well layer and said first barrier layer, a first layer of a material comprising GaAs and another element, wherein said material of said first layer has a bandgap energy between the bandgap energies of said first barrier layer and said quantum well layer and wherein a fraction of said another element is graded, said fraction increasing toward said quantum well layer.

2. The light-emitting device of claim 1 wherein said other element is nitrogen and wherein said fraction increases from zero percent at said first barrier layer to approximately one percent at said quantum well layer.

3. The light-emitting device of claim 1 wherein said other element is indium and wherein said fraction increases from zero percent at said first barrier layer to approximately 10–20 percent at said quantum well layer.

4. The light-emitting device of claim 1 further comprising a second layer sandwiched between said quantum well layer and said second barrier layer, said second layer comprising GaAs and another element, wherein said second layer has a bandgap energy between the bandgap energies of said second barrier layer and said quantum well layer.

5. The light-emitting device of claim 1 further comprising a carrier capture element cooperatively disposed relative to said quantum well layer, said carrier capture element in combination with said quantum well layer capturing more carriers than would be captured by said quantum well layer alone.

6. The light-emitting device of claim 5 wherein said carrier capture element comprises an auxiliary quantum well layer proximate to said quantum well layer, wherein said auxiliary quantum well layer has a ground state energy substantially aligned with a non-ground energy state of said quantum well layer to provide resonant tunneling of carriers from said auxiliary quantum well layer to said quantum well layer.

7. The light-emitting device of claim 5 wherein said carrier capture element comprises a carrier reflector proximate to said quantum well layer, said carrier reflector for reflecting carriers not captured by said quantum well layer back toward said quantum well layer.

8. The light-emitting device of claim 1 comprising a vertical-cavity surface-emitting laser (VCSEL) for generating optical signals having a wavelength of approximately 1200 nanometers or more.

9. A light-emitting device, comprising:
    a quantum well structure defining a quantum well; and
    a carrier capture element located adjacent said quantum well to increase the effective carrier capture cross-section of said quantum well, wherein said carrier capture element comprises a first auxiliary quantum well, wherein said first auxiliary quantum well has a ground state energy substantially aligned with a non-ground energy state of said quantum well to provide resonant tunneling of carriers from said first auxiliary quantum well to said quantum well.

10. The light-emitting device of claim 9 further comprising a second auxiliary quantum well located on the opposite side of said quantum well from said first auxiliary quantum well, wherein said second auxiliary quantum well has a ground state energy substantially aligned with a non-ground energy state of said quantum well to provide resonant tunneling of carriers from said second auxiliary quantum well to said quantum well.

11. The light-emitting device of claim 9 further comprising a second auxiliary quantum well located on the same side of said quantum as said first auxiliary quantum well, wherein said second auxiliary quantum well has a ground state energy substantially aligned with a non-ground energy state of said first auxiliary quantum well to provide resonant tunneling of carriers from said second auxiliary quantum well to said first auxiliary quantum well.

12. The light-emitting device of claim 11 wherein at least one of said first and second auxiliary quantum wells comprises gallium arsenide nitride (GaAsN).

13. The light-emitting device of claim 12 wherein a fraction of nitrogen is graded, said fraction increasing toward said quantum well.

14. The light-emitting device of claim 11 wherein at least one of said first and second auxiliary quantum wells comprises indium gallium arsenide (InGaAs).

15. The light-emitting device of claim 14 wherein a fraction of indium is graded, said fraction increasing toward said quantum well.

16. The light-emitting device of claim 9 further comprising a carrier reflector, said carrier reflector for reflecting carriers not captured by said quantum well back toward said quantum well.

17. The light-emitting device of claim 16 wherein said carrier reflector and said quantum well are separated by a distance sufficient to prevent tunneling from said quantum well to said reflector.

18. The light-emitting device of claim 16 wherein said carrier reflector is sized to maintain coherence of carriers across said reflector.

19. The light-emitting device of claim 16 wherein said carrier reflector comprises alternating layers of gallium arsenide nitride (GaAsN) and gallium arsenide (GaAs).

20. The light-emitting device of claim 19 wherein a layer of GaAsN is approximately two nanometers thick and a layer of GaAs is approximately three nanometers thick.

21. The light-emitting device of claim 16 wherein said carrier reflector provides a barrier height in excess of about 300 millielectron volts (meV).

22. The light-emitting device of claim 9 wherein said quantum well structure comprises a quantum well layer comprising indium gallium arsenide nitride (InGaAsN) sandwiched between a first barrier layer and a second barrier layer, said first and second barrier layers comprising gallium arsenide (GaAs).

23. The light-emitting device of claim 22 further comprising a layer disposed between said quantum well layer and said first barrier layer, said layer comprising GaAs and another element.

24. The light-emitting device of claim 23 wherein a fraction of said element is uniform within said layer.

25. The light-emitting device of claim 23 wherein a fraction of said element is graded, said fraction increasing toward said quantum well layer.

26. The light-emitting device of claim 23 wherein said element is nitrogen or indium.

27. The light-emitting device of claim 9 comprising a vertical-cavity surface-emitting laser (VCSEL).

28. A light-emitting device, comprising:
a first barrier layer and a second barrier layer;
a quantum well layer sandwiched between said first and second barrier layers;
sandwiched between said quantum well layer and said first barrier layer, a first layer of a material having a bandgap energy between the bandgap energies of said first barrier layer and said quantum well layer, wherein said first layer comprises the same elements as said first and second barrier layers plus nitrogen; and
a carrier capture element located adjacent said quantum well layer to increase the effective carrier capture cross-section of said quantum well layer.

29. The light-emitting device of claim 28 wherein a fraction of said nitrogen is graded, said fraction increasing toward said quantum well layer.

30. The light-emitting device of claim 28 wherein a fraction of said nitrogen is uniform within said first layer.

31. The light-emitting device of claim 28 wherein said carrier capture element comprises an auxiliary quantum well layer proximate to said quantum well layer, wherein said auxiliary quantum well layer has a ground state energy substantially aligned with a non-ground energy state of said quantum well layer to provide resonant tunneling of carriers from said auxiliary quantum well layer to said quantum well layer.

32. The light-emitting device of claim 28 wherein said carrier capture element comprises a carrier reflector proximate to said quantum well layer, said carrier reflector for reflecting carriers not captured by said quantum well layer back toward said quantum well layer.

33. The light-emitting device of claim 28 wherein said first and second barrier layers comprise gallium arsenide (GaAs), said quantum well layer comprises indium gallium arsenide nitride (InGaAsN), and said first barrier layer comprises gallium arsenide nitride (GaAsN).

34. A light-emitting device, comprising:
a quantum well structure defining a quantum well; and
a carrier capture element located adjacent said quantum well to increase the effective carrier capture cross-section of said quantum well, wherein said carrier capture element comprises a carrier reflector, said carrier reflector for reflecting carriers not captured by said quantum well back toward said quantum well.

35. The light-emitting device of claim 34 wherein said carrier reflector and said quantum well are separated by a distance sufficient to prevent tunneling from said quantum well to said reflector.

36. The light-emitting device of claim 34 wherein said carrier reflector is sized to maintain coherence of carriers across said reflector.

37. The light-emitting device of claim 34 wherein said carrier reflector comprises alternating layers of gallium arsenide nitride (GaAsN) and gallium arsenide (GaAs).

38. The light-emitting device of claim 37 wherein a layer of GaAsN is approximately two nanometers thick and a layer of GaAs is approximately three nanometers thick.

39. The light-emitting device of claim 34 wherein said carrier reflector provides a barrier height in excess of about 300 millielectron volts (meV).

* * * * *